United States Patent
Ungar et al.

(10) Patent No.: US 10,673,723 B2
(45) Date of Patent: Jun. 2, 2020

(54) SYSTEMS AND METHODS FOR DYNAMICALLY RECONFIGURING AUTOMATIC TEST EQUIPMENT

(71) Applicant: A.T.E. Solutions, Inc., El Segundo, CA (US)

(72) Inventors: Louis Yehuda Ungar, Playa del Rey, CA (US); Tak Ming Mak, Union City, CA (US); Neil Glenn Jacobson, Los Altos, CA (US)

(73) Assignee: A.T.E. SOLUTIONS, INC., El Segundo, CA (US)

( * ) Notice: Subject to any disclaimer, the term of this patent is extended or adjusted under 35 U.S.C. 154(b) by 0 days.

(21) Appl. No.: 15/866,286

(22) Filed: Jan. 9, 2018

(65) Prior Publication Data

US 2018/0205621 A1    Jul. 19, 2018

Related U.S. Application Data

(60) Provisional application No. 62/446,135, filed on Jan. 13, 2017.

(51) Int. Cl.
| | |
|---|---|
| *G01R 31/28* | (2006.01) |
| *H04L 12/26* | (2006.01) |
| *G01R 31/319* | (2006.01) |
| *G06F 11/263* | (2006.01) |
| *G06F 11/22* | (2006.01) |

(52) U.S. Cl.
CPC ...... *H04L 43/087* (2013.01); *G01R 31/31905* (2013.01); *G01R 31/31908* (2013.01); *G06F 11/221* (2013.01); *G06F 11/263* (2013.01); *H04L 43/50* (2013.01); *H04L 43/0847* (2013.01); *H04L 43/14* (2013.01)

(58) Field of Classification Search
CPC ....... H04L 43/087; H04L 43/50; H04L 43/14; H04L 43/0847; G06F 11/221
See application file for complete search history.

(56) References Cited

U.S. PATENT DOCUMENTS

| | | | | |
|---|---|---|---|---|
| 2004/0267487 | A1* | 12/2004 | Brown | G01R 31/31703 702/120 |
| 2005/0253617 | A1* | 11/2005 | Roberts | G01R 31/319 324/756.02 |
| 2005/0258856 | A1* | 11/2005 | Kishimoto | G01R 31/31712 324/762.02 |
| 2008/0028269 | A1* | 1/2008 | Imming | G01R 31/2834 714/738 |
| 2012/0112786 | A1* | 5/2012 | Fox | G01R 31/3016 326/16 |

(Continued)

*Primary Examiner* — Dac V Ha
(74) *Attorney, Agent, or Firm* — Mannava & Kang, PC

(57) ABSTRACT

A dynamically reconfigurable interface for an automatic test equipment is disclosed where one or more synthetic instruments transmit the high speed signals as well as receive the high speed signals from a device under test so that testing can be performed at speeds higher than the ATE was originally designed to accommodate. Synthetic instruments are implemented on a field programmable gate array (FPGA) that operate at higher speeds than COTS instruments and can reach the frequencies that high speed I/O buses use. SIs can be created by configuring the FPGA, with different configurations creating different SIs. A single FPGA can house a number of SIs.

26 Claims, 5 Drawing Sheets

(56) References Cited

U.S. PATENT DOCUMENTS

2013/0145212 A1* 6/2013 Hsu ..................... G06F 11/2733
                                                          714/27
2013/0234723 A1* 9/2013 Behrens ............. G01R 31/3191
                                                          324/537
2018/0285225 A1* 10/2018 Kumar .................. G06F 11/221

* cited by examiner

SYSTEMS AND METHODS FOR DYNAMICALLY RECONFIGURING AUTOMATIC TEST EQUIPMENT

CROSS-REFERENCES TO RELATED APPLICATIONS

This application claims priority from U.S. Provisional Patent Application No. 62/446,135, filed Jan. 13, 2017, the content of which is incorporated by reference in its entirety.

This invention was made with Government support under N68335-16-C-0434 awarded by the Department of the Navy. The Government has certain rights in this invention.

BACKGROUND

High speed testing of integrated circuit bus structures is an emerging technology. The rapid doubling of digital signal speeds, now reaching from 56 Gbps (giga bits per second, where giga is 1,000,000,000) to 112 Gbps in state-of-the-art circuits, requires new measurement solutions. Additionally, it is not sufficient in a test to simply apply a traditional test signal and evaluate a response within the given specifications. By the very nature of tests and the need to detect and diagnose faults and failures, well controlled out of specification signals need to be evaluated. For example, it is preferable not only to measure noise that is on a signal to determine whether it is within tolerable limits, but to also conduct a comprehensive test to generate controlled noise to make a determination whether a unit under test (UUT) is good or faulty.

Moreover, when the bus speeds are greater than 1 Gbps, standard communication protocols are used. These include synchronous optical network (SONET), Gigabit Ethernet (GBE), fiber channel (FC), and Optical Internetworking Forum (OIF). The approaches to input/output in the Gbps range differ primarily based on clock speeds and the architectures used. Global clock I/O architecture, where a single clock is tied to all parts of the system, is common for lower speed applications. When speeds of 200 Mbps are reached, however, a large difference (skew) exists between the clock's arrival times at one module as compared with another. To overcome these limitations, the Source Synchronous (SS) I/O architecture was introduced that essentially sends a strobe signal along with the data stream so that the receiving circuit can use the strobe to clock the signal. This helps to reduce clock skewing error. The SS architecture can deal with signal integrity degradations for up to 1 Gbps.

For bit rates above 1 Gbps, a serializer/deserializer (SerDes) data transfer approach may be employed. In addition to transferring data bits serially from transmitter to receiver, the transmitter embeds the clock into the bit stream. This is accomplished in several ways, with the most common being a 8 b/10 b encoding scheme. Essentially, the method maps 8-bit data into 10-bit data format so that transitions between 1s and 0s in the bit stream will be mostly balanced. This provides sufficient information to be able to decipher the clock rate. On the receiver side a clock recovery circuit, usually a phase locked loop (PLL), is used to fully recover the clock and a dual decoder extracts the clock from the data and reconstructs it to the original 8-bit data.

One of the most important failure modes that have to be characterized in embedded clock architectures is phase jitter. Phase jitter is a time deviation of an edge transition from its ideal time and location, and is caused by various sources of noise. The total jitter breaks down into a deterministic jitter (DJ) and a random jitter (RJ). Each of these in turn can be broken down further, where random jitter includes Gaussian jitter (GJ) and multiple Gaussian jitter (MGI), and deterministic jitter includes data dependent jitter (DDJ), periodic jitter (PJ), and bounded-uncorrelated jitter (BUJ). DDJ breaks down further into duty cycle distortion (DCD) and inter-symbol interference (ISI). One of the great challenges of high speed testing is to separate the various jitter types as they each communicate different information about the true nature of the failure.

Testing embedded clock for signals in excess of 1 Gbps utilizes a combination of tests, including jitter, noise and bit error rate (BER), collectively referred to as JNB tests (for jitter, noise and BER combined). They can be categorized as follows:

1. JNB output test—Verifies the performance of the transmitter or the transmitter plus the medium or channel. It may also include testing the reference clock.
2. JNB tolerance test—Involves setting the worst-case jitter and noise conditions at the receiver input pin and measuring the BER at its output.
3. JNB system test—Checks the overall BER comparing data bits received by the receiver against those sent by the transmitter.

A number of different types of delays can disturb the digital portions of these high speed I/O circuits, for which tests need to be developed. These include, but are not limited to the following:

1. Transient faults, including slow-to-rise, slow to fall delay faults.
2. Inline-delay faults that are due to resistive interconnect bias, which slow down both rising and falling transitions.
3. Gate-delay faults (also called local delay faults) that become more predominant when the longest path for transition is tested.
4. Path-delay faults, which are similar to gate-delay faults, but it may be caused by multiple gate-delays where one alone would not necessarily cause a failure.

A number of other failure modes peculiar to high speed I/O testing also exists. They include, but are not limited to, the following:

1. Lossy Signal—At multiple Gbps data rates a digital waveform appears to be an analog waveform at the receiver input because of the frequency-dependent lossy property of the channel and medium (such as PCB traces, cables, connectors).
2. Unit Interval (UI) shrinkage—UI is the data period, which is the inverse of the frequency at the which data is transmitted. As data rate increases jitter reduces the data valid window—generally termed as available portion of UI, the period during which digital bit can exist. The effectively useable UI becomes shorter and shorter as frequency increases.
3. Equalization failure—Equalization compensates for frequency-dependent losses (rolling off at the high end) characteristics of the channel or media, and the clock recovery circuit helps to track the data even though it is jittery. A highly jittery transmitter may work well with a particular receiver that has good equalization, while it fails with defective equalization. Such a transmitter may be misdiagnosed as faulty when it is not. This may make it difficult to diagnose the faulty components or could cause false alarms.
4. Crosstalk—Maximum Aggressor (MA) is a fault model that defines faults based on the resulting crosstalk error. Effects include positive glitch, negative glitch, rising delay and falling delay. For a set of N interconnects, the MA fault model considers the collective aggressor effects on a given victim line Yi with all other N−1 wires act as aggressors.

Current high speed, state-of-the-art automated test equipment (ATE) are primarily aimed at testing integrated circuits (ICs) and system-on-chip (SOC) applications. The ATE takes advantage of design for testability (DFT) techniques, including built-in self-test (BIST) affecting the device under test (DUT) prior to design finalization. Boards and modules, such as shop replaceable units (SRUs) and line replaceable units (LRUs) are typically not designed with sufficient DFT to allow the same test methods to be utilized. While efforts towards better DFT of LRUs and SRUs are encouraged, it would be naïve to expect that all UUTs being tested by commercial and military board and system ATEs will have the desired DFT features to assist tests sufficiently to overcome all of the obstacles that the actual system encounters. The need persists and is steadily increasing for test tools that not only handle conventional data buses, but also the testing needs of new high speed data buses that are being incorporated in the latest system enhancements. Next-generation UUTs are designed with high-throughput buses ranging from 100 Mbps to 1500 Mbps, and utilize various data buses (e.g., Firewire, RS-422, Wi-Fi, HDMI, and SATA). It is very likely that soon Universal Serial Bus ("USB") 3.0 buses will be ubiquitous in the majority of systems, and these buses can operate in the 5 Gbps range. USB 3.1 is already commercially available, and it transfers data at 10 Gbps. All this drives a need for faster digital communication buses in automatic test equipment to facilitate testing, file upload and download, and other UUT interactions.

Traditionally, an automatic test equipment (ATE), sometimes called automatic test system (ATS), has been used to apply stimuli to and collect responses from a unit under test (UUT). This is normally accomplished by switching stimulus and measurement instruments in the ATE to UUT input and output pins, respectively. The stimulus and measurement instruments can be custom designed and built within the ATE, or more likely commercial off the shelf (COTS) general purpose instruments that are patched together with switching circuits. The issues with either built-in instrumentations or COTS instruments are that they are built with today's components but need to be able to test for tomorrow's circuits. Thus they either drop behind the performance curve fast or have to procure very expensive components (e.g., SiGe, or GaAs) to build these measurement instruments and inflate the cost. Since these COTS instruments need to address a generic (wider) application, they usually have much more capabilities that are not needed for ATE purposes, thus further inflating their price. For custom built-in instruments, their applications are dedicated within an ATE system, thus the large R & D required to develop them are amortized over a limited number of ATE systems, also inflating the cost.

A test program set (TPS) is developed for each UUT by a test engineer through an often long, tedious and challenging process at a high cost over a considerable duration of time. The TPS consists of three elements, namely, a test program in a language the ATE understands, documentation about the theory behind each test for debug and diagnostic purposes, and an interface test adaptor (ITA) (sometimes called interface device or ID) that mates the ATE and the UUT both mechanically and electronically so that the ATE can test the UUT. A major challenge faced by the industry is that the ATE is not able to address current technology capabilities of the UUT. As unit under test (UUT) technology capabilities improve in various parameters, such as in higher speed operations, ATEs become less proficient in detecting their faults. It is unfeasible to continuously replace ATEs with newer and updated models each time UUT technology changes. Unfortunately, over time the gap between existing ATE capabilities and UUT limits becomes more significant, and with constraints in ATE expenditures and configuration changes it is difficult or impossible to effectively test high speed UUTs with existing ATEs. Upgrading ATE capabilities to meet today's high speed applications, if at all possible or feasible, is at best a temporary solution since new, higher speed bus structures are introduced all the time. A related problem is the increased complexity of the tests themselves, requiring ever more complex test equipment and more complicated and time consuming TPS development manually by test engineers. A ubiquitous solution is needed that will allow legacy and existing ATEs to adapt to and test continuously updated and improved high speed UUTs, and to do so within a feasible time and cost constraint.

Moreover, traditional test methods where stimuli are applied and responses collected by the ATE are not properly supported at these high speeds, especially not in current automatic test system environments. New methods and tools are needed that will aid in the support of state-of-the-art bus technologies, and also ensure the integrity, quality, and reliability of the signals and data communication associated with the buses. While it is unfeasible to change either the UUT or the ATE for a required test, the TPS with all its elements can be customized to overcome incompatibilities. Reusable elements within the TPS is a novel concept that has not been utilized. In the present invention, reusable test programs and reusable interfaces are used not only to provide solutions for automatic testing of high speed and complex circuits, but in the process lower the TPS development costs throughout the industry.

Many of these high speed signaling protocols are asynchronous in nature, i.e., the sending and receiving end will test to see if a specified sequence is received at the other end, and failing to receive that, the sending/receiving pair will either change the signaling rate (performance) and/or change the adaptation circuits to try and recover the signals. Each signaling standard, such as USB, SATA, or Ethernet, have their unique protocols. Sometimes, from one version of the standard to another, the protocol can change significantly (e.g., USB 2.0 to USB 3.0). This handshake of the signaling breaks the pattern matching nature of today's ATE architecture, where a single mismatch fails the UUT and sends it to the scrap bin.

The present invention circumvents most, if not all such obsolescence factors by utilizing reconfigurable instruments embedded in a FPGA. If even the current FPGA-based instrument is unable to keep up with UUT characteristic improvements, replacing the FPGA with a more modern and higher performance FPGA can readily "update" the ATE to overcome the obsolescence. As an additional benefit not available in today's ATE, the present invention presents reconfigurable test instruments that facilitate test program set (TPS) reuse. Since TPS development is a costly and time consuming endeavor, a great deal of savings can be gained from reusing TPSs in part or in their entirety in testing other UUTs.

SUMMARY OF THE INVENTION

The present invention seeks to overcome the differences between the high speed UUT that comes into the market and the existing low speed ATE in place in the testing facilities by creating unique UUT Device Interfaces (UDIs) as part of the test program set (TPS). A TPS consists of a test program, an interface between the UUT and the ATE, and documentation. The invention comprises a new type of TPS, whereby a highly complex, high speed circuit may be made testable by a low speed, low complexity ATE. The UDI element recognizes the requirements for testing complex forms of data communication, and required industry standards, to ensure an open architecture approach is integrated in the resulting technologies. These technologies involve extremely high speed data rates, complex timing and synchronization, and high speed multiplexing, all of which require parameters that are capable of insuring signal integrity. Some of these parameters involve statistical measurements, bit error rates, and complex signal to noise and distortion measurements.

An Automatic Test Equipment (ATE) is designed to test electronic circuits. The ATE may utilize the fastest electronics technology available when the ATE was designed, but as faster technology emerges, the ATE is unable to test that technology. There are several reasons for the speed limitation. The two most prominent reasons cannot be overcome by the ATE architecture. The first is that the instrumentation cannot apply speeds and/or collect responses at the speed required to test the high speed UUT. The second is that the signals applied or received between the instruments and the UUT are further degraded and interfered with by the interface between them. In the best of circumstances this interface includes cabling and switching, which already distorts the signal sufficiently to make accurate signal transmission impossible. In many cases, interface circuitry within the ITA or ID is used for signal conditioning or to create electrical compatibility between the instrument or ATE and the UUT.

The present invention utilizes one or more synthetic instruments to transmit the high speed signals as well as receive the high speed signals so that testing can be performed at speeds higher than the ATE was originally designed to accommodate. Synthetic instruments (SIs) can be implemented within, for example, a single chip field programmable gate array (FPGA) that operate at higher speeds than COTS instruments and can reach the Gbps frequencies that high speed I/O buses use. SIs can be created by configuring the FPGA, with different configurations creating different SIs. A single FPGA can house a number of SIs.

The configuration is accomplished by programming the FPGA with coded instructions housed in memory modules, such as programmable read only memories (PROMs) and Flash memories. FPGAs, including the memory modules, are small enough to build into the ITA. In doing so, the SIs can be placed physically closer to the UUT than a COTS instrument can be, which also improves signal integrity. Another major improvement for signal integrity comes from the fact that SIs do not need to be switched as instruments do, eliminating another source of signal degradation. Because switching is not needed, multiple SIs can apply stimuli and collect responses simultaneously in parallel or under some specific timing specified by the TPS. The number of SI instruments that can be placed into a single FPGA far exceeds the number of COTS instruments. Thus, the test engineer developing the TPS has more flexibility in testing a UUT with SIs than with stand-alone instruments.

Unlike with COTS stimulus instruments, utilizing generically programmable or reconfigurable devices, such as FPGAs, to apply stimuli, one can include noisy or faulty stimuli to margin test high speed buses. Contrary to "normal" test equipment that can only generate "good" signals, the present invention uses the FPGA to generate and apply signals that are characteristic of "faulty" signals as well. The FPGA could also be used to analyze the results, tune, and modify the tests based on the results. It also compresses the result and logs to speed transmission. The SI in the FPGA, unlike a conventional instrument, can be programmed to compensate for any unavoidable interferences that are known to exist in the signal path, including, but not limited to degradations caused by the connection between the SI and the UUT. The SI can be programmed to take into account the exact environment under which the SI operates or is interfaced with the UUT.

The present invention overcomes the obsolescence factors of existing ATEs by utilizing reconfigurable instruments embedded in a FPGA. If even the current FPGA-based instrument is unable to keep up with UUT characteristic improvements, replacing the FPGA with a more modern and higher performance FPGA can readily "update" the ATE to overcome the obsolescence. Further, the present invention includes a reconfigurable test instrument that eases test program set (TPS) reuse. Since TPS development is a costly and time consuming endeavor, a great deal of savings can be gained from reusing TPSs in part or in their entirety in testing other UUTs.

The present invention utilizes a test program (that runs the ATE) that can elect a particular synthetic instrument that will be used in each step of the test and how specifically that synthetic instrument is to be configured. This is different than the way traditional instruments are pre-defined by instrument manufacturers, or even the way synthetic instruments have been used. The ability for the test programmer to define the instrument is novel. It can be viewed as a collection of reconfigurable synthetic instruments or a "synthetic ATE." Additionally, self-calibrating the FPGA synthetic instrument before testing to ensure that both the test hardware as well as test program is correct/good is heretofore untried and undisclosed in the prior art.

The synthetic test hardware—within a programmable device or FPGA—may be reconfigured every time the test program is loaded into the computing controller or possibly in between test sequences. During the course of the test, the hardware is reconfigured to target a specific test (i.e., using analog-to-digital converter ADC and digital-to-analog converter (DAC) to test for an open fault or test for a short at one test and using signal generators and analyzers to test for a functional fault in another test, etc.). Hence, the synthetic test instrument may be configured in real time in situ. It plays the role of different sets of instruments as required by the test (e.g. the instrument may be a digital volt meter (DVM) at first, then become a low speed signal generator, then become a high speed waveform analyzer, etc.). Same physical device may be reconfigured to be a different test instrument in a subsequent portion of the test, hence the synthetic test instrument designation. The present invention allows the reconfiguration of the apparatus to become a different test instrument as needed, but also serves as multiple simultaneous instruments and is reconfigurable on-the-fly to perform different tests during different phases of the TPS.

The large gate count of selected FPGAs also allows entire protocol stack to be placed onto the ATE end so that the handshaking nature of the signaling protocol can be supported. Upon the training and negotiation phase, test hardware treats each signal mismatch according to the protocol and adjusts accordingly. It will not treat any mismatch as failure, rather it will just be part of the protocol sequence that needs to be handled. Each test program can load and reconfigure the FPGA for its target UUT.

One object of the present invention is to provide a test to test a particular type of bus (unit under test or UUT) by providing predeveloped coding sequences for the FPGA configuration needed to thoroughly test that bus. For example, a program would exist that would result in testing the Firewire bus. A different program would exist that would test the USB 3.1 bus. These tests (including parts of these tests) are totally reusable, allowing a test engineer to develop tests for a UUT with that type of bus in a fraction of the time it would take him/her otherwise. The reusable "bus test" could be run on any FPGA or even traditional ATEs.

The instrument of the present invention is capable of testing the complete stack of an interface (e.g. USB), from the cabling connectors to the physical layer (PHY) to the link layer and protocol layers. This will allow a technician to diagnose to the pieces of the components in this whole interface that are at the root cause of the problem. This multiple layer test process and its associated diagnosis process is not available from any existing equipment manufacturers.

With the link/protocol layer test logic, the instrument of the present invention is also capable of coping with the asynchronous nature of SerDes (Serialize/Deserialize form of transmission) during functional test (which traditional ATE would have difficulty as they use stimulus/response synchronized to the ATE clock). It is capable of logging Bit Error Rate without interruption (while most ATE would stop upon detecting first mismatch/fail). Since SerDes is ubiquitous to high speed buses, SerDes tests can be reused in testing a number of buses. A test for a particular bus can be built from a collection of SerDes and other tests. The test for a different bus can be a subset or superset of an existing bus test.

The instrument of the present invention is reprogrammable and tunable to adapt to the requirements of new UUTs. For instance, if the unit under test is a USB 3.1 device but requires higher drive, then only the portion of the instrument that needs to change to support higher drive will change. The instrument is also reprogrammable to be able to adapt to the requirements of the UUT. For instance if the UUT has a USB 3.1 bus and a HDMI bus, the instrument can first configure itself to test the USB and then reconfigure itself to test the HDMI, or the other way around. The instrument manages the speed discrepancy between the UUT and the ATE upon which it is hosted, ensuring that the test can be run at full speed and the results returned at the speed capabilities of the host ATE. The instrument can test both analog and digital characteristics of the unit under test.

One advantage that derives from a synthetic instrument of the present invention is that several copies of the same instrument can be made to test in parallel. For example, an ATE may have a limited number of digital volt meters ("DVM"), and in order to test eight outputs it would have to test each output in sequence. However, using a synthetic instrument of the present invention one can configure eight DVMs (limited only by the resources within the FPGA) so that all eight outputs can be tested simultaneously.

These and other features of the present invention will best be understood with reference to the accompanying figures and the discussion set forth in the detailed description of the invention below.

DETAILED DESCRIPTION OF THE PREFERRED EMBODIMENTS

The present invention is a furtherance of the manner in which integrated chip manufacturers have utilized design for testability in overcoming the obstacles presented by high speed I/Os. The wrappers used in system-on-chip applications are not expected to be present in the certain LRUs, but with the present invention a Test Wrapper is placed outside of the LRU using an interface board between the UUT and the ATE. This mechanism is also referred to as a UUT Device Interface (UDI). The present invention uses an intelligent wrapper that contains all the test resources necessary to apply test patterns, make JNB measurements, inject faults, provide physical layer and protocol layer test services, and collect and analyze responses. Because of high speed requirements, the present invention leads to direct and close proximity access with the UUT's Tx/Rx pair as multiplexing or even moderate distance transmissions can compromise signal integrity.

Figure 1:
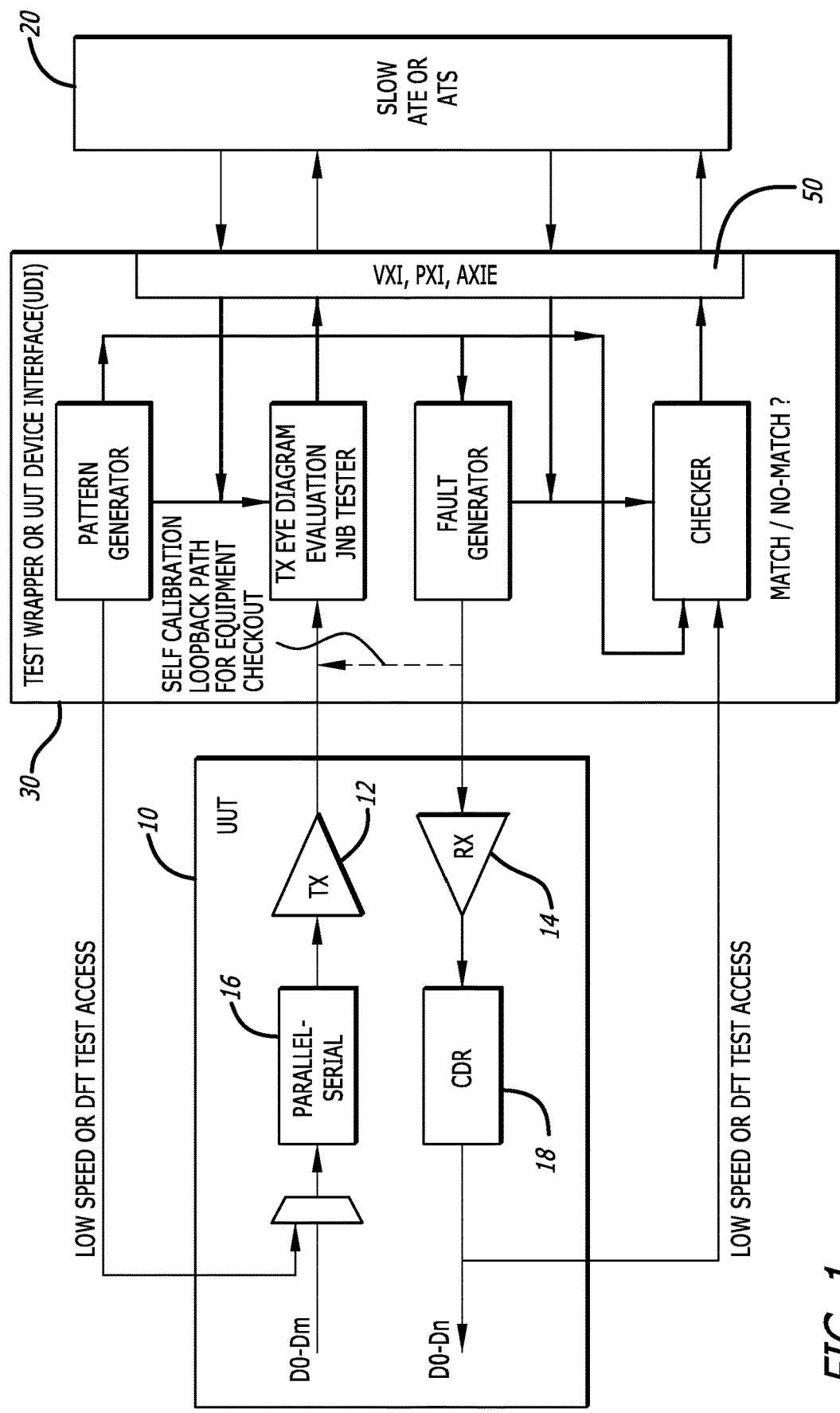
FIG. 1 a schematic of the tester interface of the present invention.

A schematic of the test architecture of the present invention is shown in FIG. 1. On the left side of the figure is an example UUT 10 (also referred to herein as a device under test or DUT) with both low speed and high speed inputs and outputs. On the right side of the figure is an Automatic Test System (ATS) 20 (also referred to as the "ATE") that commands the test. In between the high speed UUT and the ATS is a load board that serves as a UUT device interface UDI 30 for the High-Speed Input/Output Tester.

The UUT high speed I/O interface consists of a transmitter (Tx) 12 and a receiver (Rx) 14 that interfaces directly with the UDI 30, which preferably is physically located very close to the UUT to minimize delays between the UUT and the test signals to and from UDI. Behind the transmitter is a Parallel-Serial mechanism 16 that is found in SerDes types of UUTs and is used to embed the clock within the data stream. The CDR 18 connected to the receiver is the Clock and Data Recovery mechanism that decodes the bit stream and reconstructs the clock typically used in SerDes circuits.

The UDI 30 of the present invention connects with the ATS 20 through standard instrument buses 50, such as VXI, PXI, AXIe, or LXI. Software drivers for the instrument bus interface may be created using IEEE-1671 ATML drivers or some other suitable process.

Figure 2:
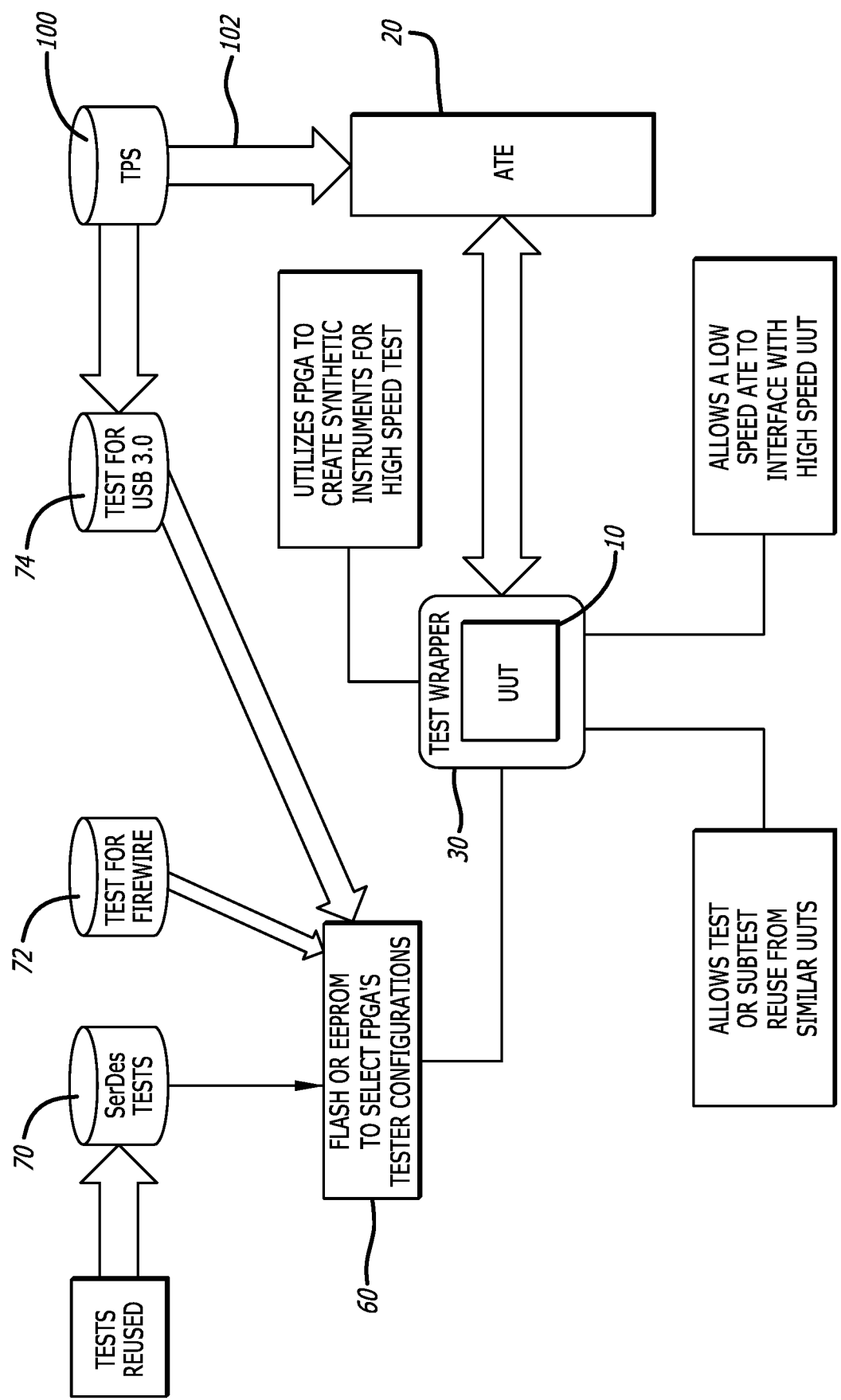
FIG. 2 is an illustration of the role the TPS plays in controlling both the ATE and the Test Wrapper of synthetic instruments.

FIG. 2 illustrates the role of the TPS 100 in the testing procedure. First, the TPS 100 is developed to control the ATE 20. A TPS developer creates the test program for the specific application's ATE by applying stimuli and collecting responses from the UUT 10 under the control of various conventional instruments. This procedure, as designated by route designated "1" will still apply for circuits and functions that are not High Speed I/O as shown with the down arrow 102 from the TPS 100 to the ATE 20. Using the present invention to test for High Speed I/O UUTs follows the route designated "2" instead or in addition to route 1. For tests that follow route 2, a memory device 60 is programmed that reconfigures the FPGA elements into "synthetic" instruments ("SIs"). It is these synthetic instruments that perform the tests. Unlike conventional instruments, they are not configured to remain constant or even exist throughout the entire test. Rather, they are invoked as needed and when their utility is completed then they can be reprogrammed. Importantly, if SerDes testing has been previously done, the configurations of those tests can be saved in a Test Database as "SerDes Tests" 70 and reused as needed. This can save TPS developers a lot of time and money by not having to redevelop tests for the myriad of buses utilizing the SerDes approach. Similarly, other tests can be saved in a Test Databases 72, 74 and reused as desired or as a subset of other tests.

The process can also be scaled up. When several SerDes tests are used to test a particular bus, say Firewire, or HDMI, or USB 3.0, those tests can also be stored in the Test Database and used again, resulting in greater savings in TPS development. Additional TPS benefits can be realized when new buses are introduced. For example, it will take a great deal less time to develop a USB 3.1 TPS using the USB 3.0 tests already developed and stored in the Test Database, than to start to develop a USB 3.1 test from scratch.

Below are the parts of that interface that is utilized for each of the test steps.

Step 1—Self Calibration

Figure 3:
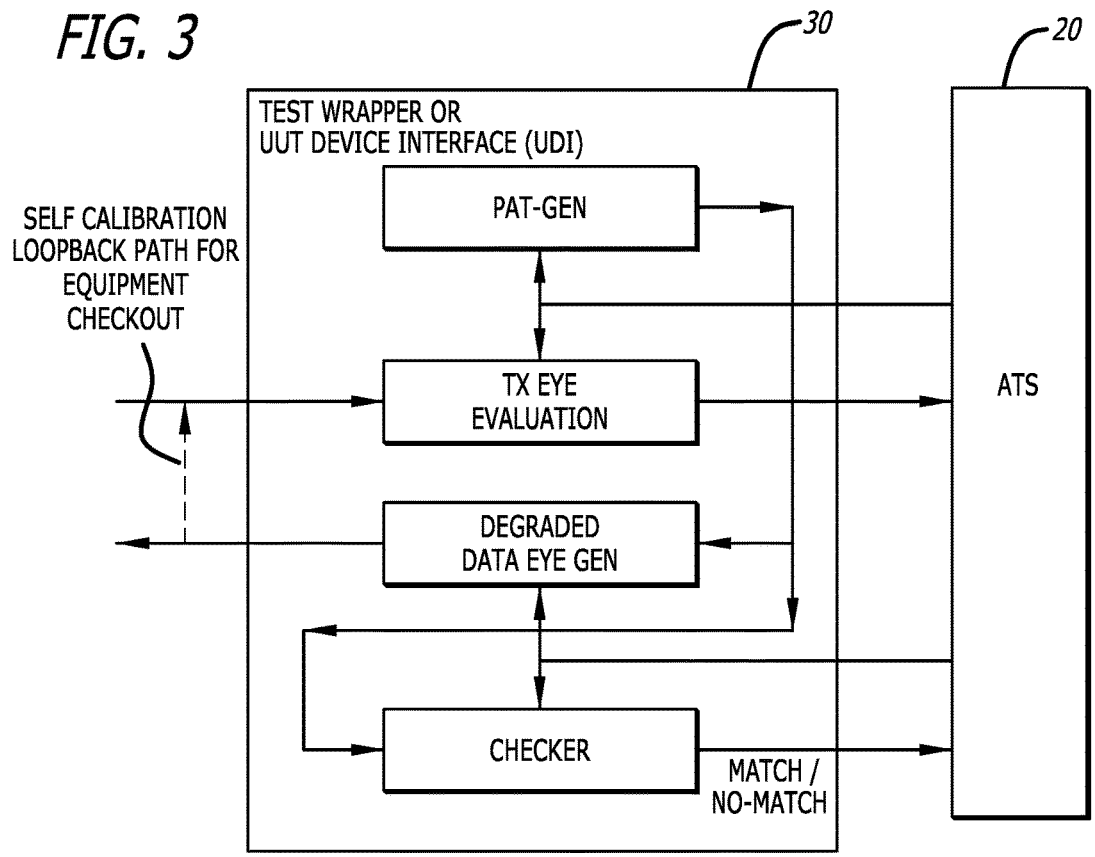
FIG. 3 is a schematic of the loopback path for the self-calibration step.

The loopback path is tested and self-calibrated without connecting to the UUT 10, as shown in FIG. 3. Internal loopback of the instrumentation confirms that the proper software and hardware are used for the test. It also provides pre-calibration and qualify test readiness.

Step 2—Cable/Harness Test

Figure 4:
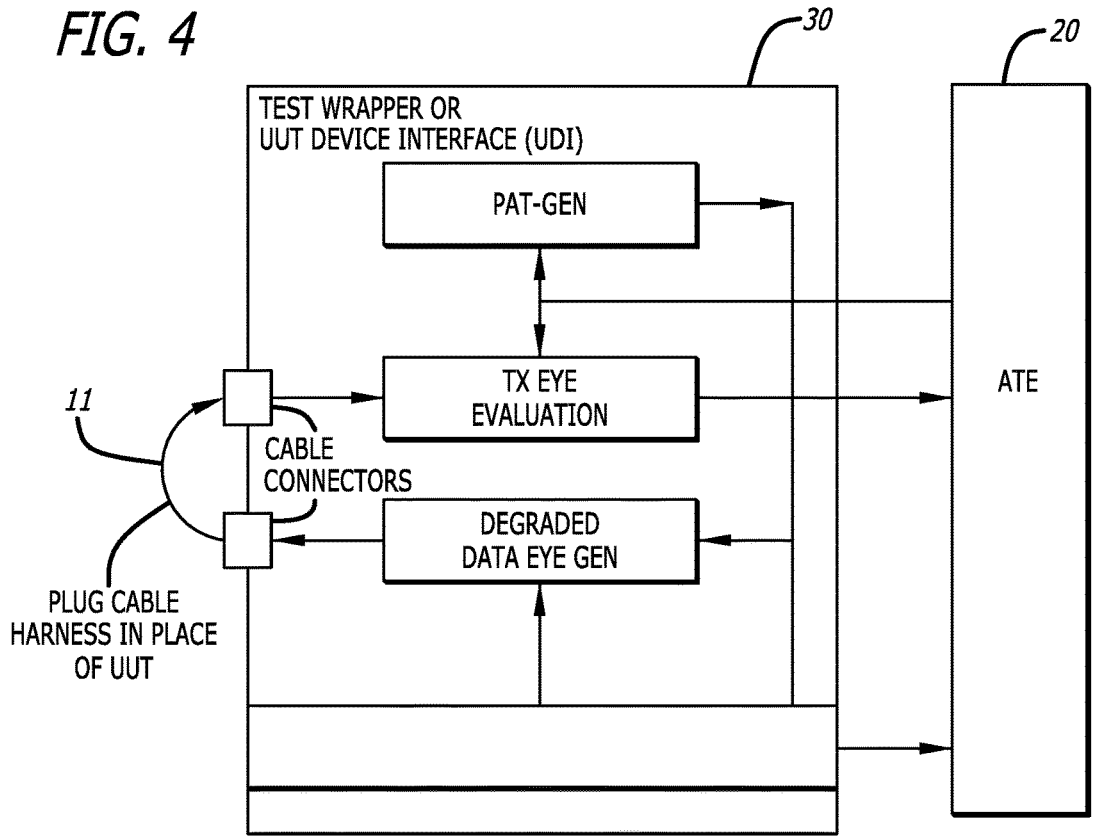
FIG. 4 is a schematic of the cable and harness connection for the cable test.

In many cases, the UUT 10 has its own connector for the SerDes and a cable 11 is needed to connect the UUT 10 to the test system as shown in FIG. 4. Before we plug the UUT 10 into the test system, we want to make sure that the cable 11 is good. This cable or wiring harness is simply connected from the Tx and Rx end of test system. This test step verifies that cables are not open, short or leaky (contamination or corrosion) and can handle high speed data.

Step 3—Transmit (Tx) Eye Margin Test

Figure 5:
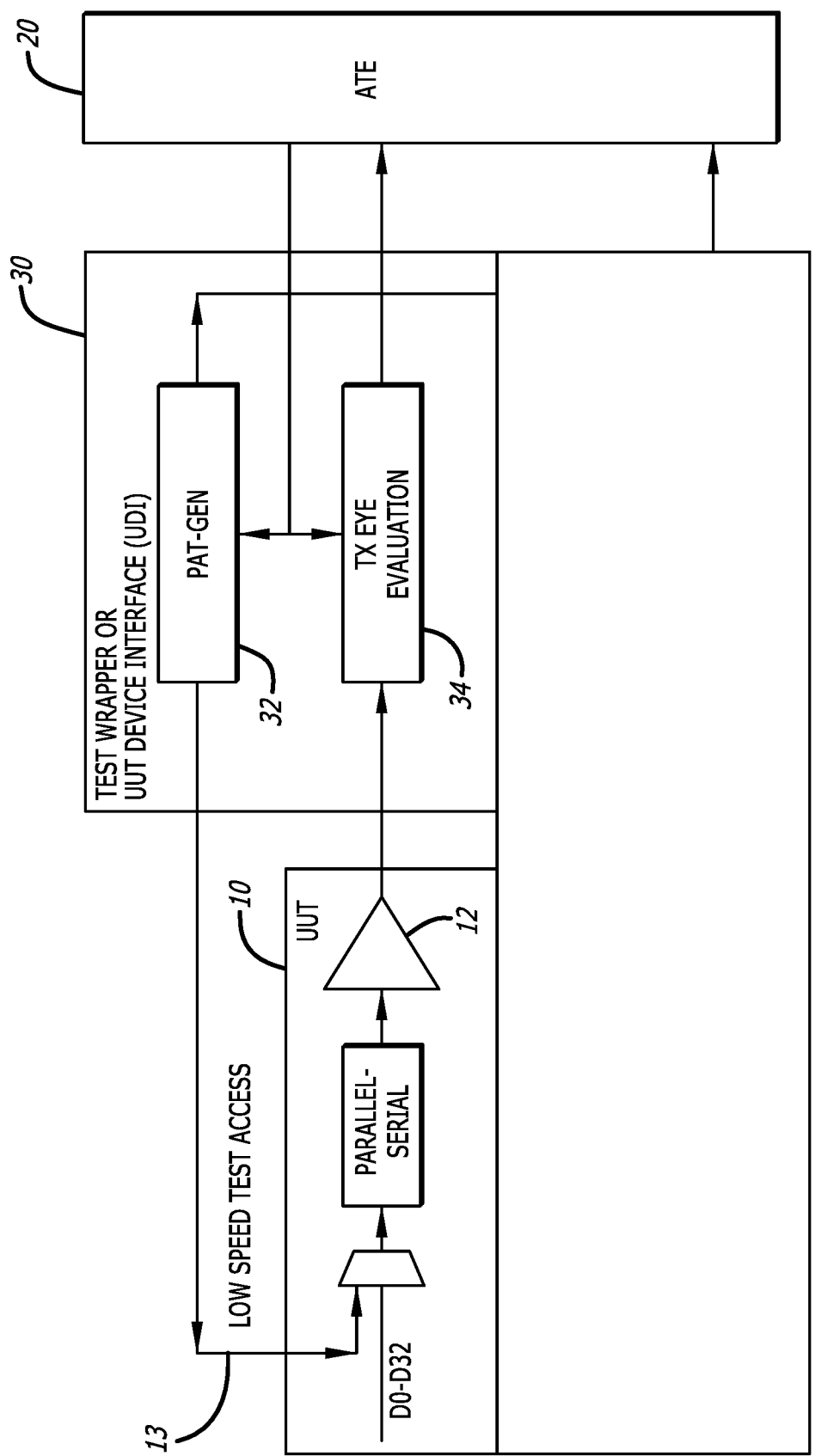
FIG. 5 is a schematic of the test configuration for the Eye Margin Test step.

The Tx 12 of the UUT 10 is tested next as shown in FIG. 5. The pattern generator 32 produces the bit sequences, which are then fed to the UUT's data input port 13. Once the test data are serialized and driven from the UUT's transmitter 12, the test system's eye evaluation circuit 34 determines the necessary figure of merit and reports back to the ATE 20.

Step 4—Receive (Rx) Test

Figure 6:
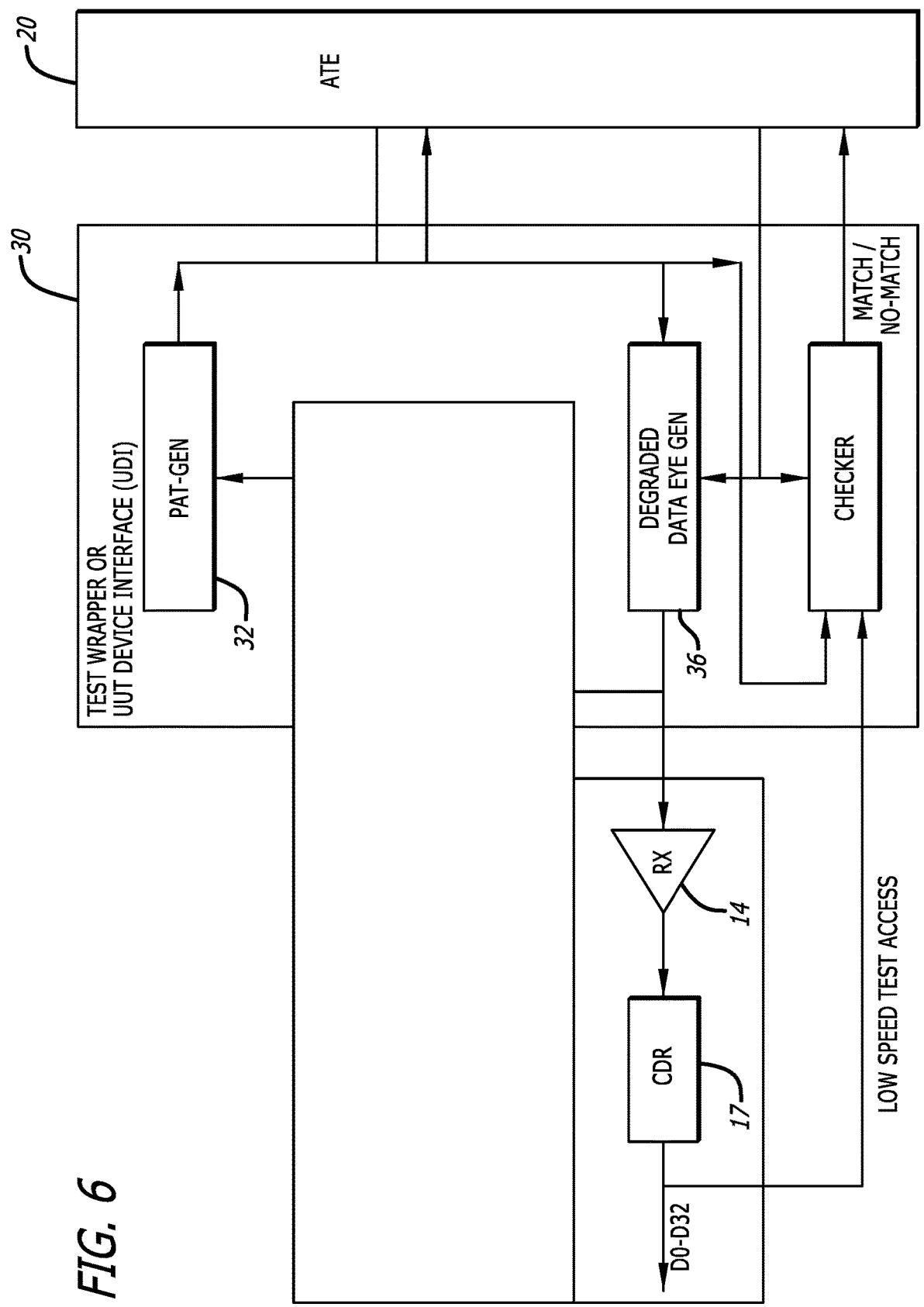
FIG. 6 is a schematic of the pattern generator for the Receive (Rx) Bit Stream Test.

In this step, the test system emulates the role of the transmitter 12 (Tx). The Pattern Generator 32 feeds patterns to the Degraded Eye Generator 36 to produce a worst-case eye for the UUT's receiver (Rx) 14 as shown in FIG. 6. A normal PLL/CDR circuit 17 within the UUT should be able to differentiate the clock/data and recreate the desired data bits. It is then streamed back to test system for checking. Note that there is a significant bandwidth difference between SerDes test data and extracted data. Appropriate buffering on the tester side have to accommodate that.

The High-Speed Input/Output Tester of the present invention embodied in a FPGA thus serves as a hardware interface between the UUT and the ATS and operates as a synthetic instrument tasked to test the physical layer of the high speed UUT I/O. This Tester can store test sequences that can be saved and repeated for all bus structures on any UUT, recognizing that many tests will be the same for all high speed I/Os at the Physical Layer. Moreover, the tester may utilize other FPGAs for higher layer protocol tests of specific buses. In addition to a repeat of "good test" protocols, those FPGAs will also generate faults in the protocol to test the veracity of the bus.

In a preferred embodiment of the present invention, the High-Speed Input/Output Tester will self-calibrate and provide the capability to test the power available to the UUT. The interface further provides a means to apply low speed stimuli at the UUT input and collect low speed stimuli at UUT outputs. This includes access to DFT mechanisms, such as boundary scan and wrappers within the UUT. It further provides a stimulus and response test environment for the high speed UUT and acts as a load board interface between the UUT and the ATS using a standard instrument bus. When serving as a synthetic test equipment (constructed within an FPGA), the tester characterizes and measures jitter, noise and bit error rate (JNB). The present invention further provides test equipment capabilities either constructed within an FPGA or connected to other instruments within the ATS, such as waveform generators, pseudorandom pattern generators, digitizers, oscillators, up and down converters, and other instruments to develop the signals that can apply other forms of stimuli and collect responses.

The Pat-Gen (pattern generator) 32 supplies the test patterns either directly from the ATE 20 or derived from the test mechanism and applies it to low speed and high speed I/Os. The JNB tester is a synthetic instrument that can perform the functions of jitter, noise and bit error testing and analyze the responses. Along with other stored information and algorithms, the JNB tester realized in the FPGA firmware is able to detect and diagnose failures. The fault generator mechanism supplies noises, errors, jitter and other distortions for UUT Rx tests. This is a key feature that is not found with commercial test offering.

Other features of the invention include modules that perform the functions of the invention. The Checker module is tasked with collecting responses at speed and analyzing them. Only pass/fail and diagnosis results need to be sent to the ATS at a speed that the ATS can handle. All of the above modules are mostly built out of FPGA resources. Hence, they are very reusable for expansion to include new test features, either in the protocol/logic or in analog domains.

We claim:

1. A method for testing a device under test (DUT), comprising:
providing a plurality of synthetic instruments in a programmable system, wherein each of the plurality of synthetic instruments is automatically and dynamically reconfigurable to perform a plurality of test functions by:
applying least one stimulus to the device, wherein:
the stimulus is based on a clocking technique, and
the device comprises at least one of a device under test (DUT) or a unit under test (UUT);
receiving a response to the at least one stimulus, wherein the response identifies a type of test function from among the plurality of test functions to be performed on the device;
assigning each of the plurality of synthetic instruments at least one test function based on the response to the at least one stimulus;
instructing each of the plurality of synthetic instruments to carry out the assigned test function; and
communicating test results obtained by the synthetic instruments to an external device;
wherein the plurality of synthetic instruments performs test functions in accordance with the a test program created for the external device, wherein the test program is configurable on-the-fly to instruct the plurality of synthetic instruments to perform the plurality of test functions associated with different types of test instruments and multiple instances of a single type of test instrument in parallel during different phases of the test program.

2. The method of claim 1, wherein the plurality of synthetic instruments interrogates the device using at least one of variable frequency, filtering, or fault injection.

3. The method of claim 1, wherein the external device is an automated test equipment (ATE).

4. The method of claim 1, wherein the plurality of synthetic instruments is configured by the test program to perform different test functions for successive tests.

5. The method of claim 1, wherein the plurality of synthetic instruments is configured by the test program to perform multiple test functions during a single test.

6. The method of claim 1, wherein the plurality of synthetic instruments is used to test serializer/deserializer (SerDes) data transfer.

7. The method of claim 1, wherein the plurality of synthetic instruments is used to test at least one of jitter, noise, or bit error rate (BER) of the device in accordance with the clocking technique.

8. The method of claim 1, wherein the plurality of synthetic instruments is used to test a plurality of delay faults.

9. An interface for an automatic test equipment (ATE), the interface comprising:
a field programmable gate array (FPGA) that transmits test signals and receives test responses at speeds above the ATE maximum speed, wherein the FPGA is configurable to a plurality of configurations;
a plurality of synthetic instruments communicatively coupled to the FPGA to switch the FPGA between the plurality of configurations, wherein:
each of the plurality of synthetic instruments is automatically and dynamically reconfigurable to perform a plurality of test functions in accordance with a determined type of test function based on a device under test (DUT) or a unit under test (UUT) to which the interface is communicatively coupled, and
the plurality of synthetic instruments performs test functions in accordance with the plurality of configurations associated with different types of test instruments, which when configured on-the-fly by a test program, the plurality of synthetic instruments to perform the plurality of test functions associated with the different types of test instruments and multiple instances of a single type of test instrument in parallel during different phases of the test program; and
a plurality of memory modules communicatively coupled to the plurality of synthetic instruments and the FPGA, wherein each of the plurality of memory modules comprises instructions for generating a configuration of the FPGA.

10. The interface of claim 9, wherein the plurality of synthetic instruments applies test signals and receives test responses in order to simultaneously and continuously perform a plurality of test functions.

11. The interface of claim 9, wherein the plurality of synthetic instruments applies a test signal and receive a test response according to a predetermined timing specified by a test program.

12. The interface of claim 9, wherein the FPGA sends a test signal representative of a faulty signal.

13. The interface of claim 9, wherein FPGA analyzes the test response and automatically modifies the test signal based thereon.

14. The interface of claim 9, wherein the FPGA compresses the test results to facilitate transmission.

15. The interface of claim 9, wherein at least one of the plurality of synthetic instruments is programmed to compensate for known interference in a signal path.

16. The interface of claim 15, wherein the known interference comprises degradation due to connection between the FPGA and the DUT or UUT.

17. The interface of claim 9, wherein the plurality of synthetic instruments is embedded in the FPGA.

18. The interface of claim 9, wherein the interface is updated by replacing the FPGA with an updated FPGA.

19. The interface of claim 9, wherein the FPGA comprises at least one of a complex programmable logic device (CPLD) or programmable array logic (PAL).

20. The interface of claim 9, wherein the FPGA is replaceable by a processor of a computing system.

21. The interface of claim 9, wherein the ATE includes a test program that selects a specific synthetic instrument for use in each step to configure the interface so as to carry out the test functions.

22. The interface of claim 19, wherein the test protocol controls how a particular synthetic instrument is configured.

23. The interface of claim 9, wherein the plurality of synthetic instruments are self-calibrated before testing to ensure that both hardware and software functionality.

24. The interface of claim 9, wherein the plurality of synthetic instruments is configured in real time in situ.

25. The interface of claim 9, wherein the plurality of synthetic instruments function as multiple instruments during a single test.

26. A non-transitory computer-readable storage medium having an executable stored thereon, which when executed, instructs a processor to:
provide a plurality of synthetic instruments in a programmable system, wherein each of the plurality of synthetic instruments is automatically and dynamically reconfigurable to perform a plurality of test functions;
apply at least one stimulus to the device, wherein the stimulus is based on a clocking technique, and the device comprises at least one of a device under test (DUT) or a unit under test (UUT);
receive a response to the at least one stimulus, wherein the response identifies a type of test function from among the plurality of test functions to be performed on the device;
assign each of the plurality of synthetic instruments at least one test function based on the response to the at least one stimulus;
instruct each of the plurality of synthetic instruments to carry out the assigned test function; and
communicating test results obtained by the synthetic instruments to an external device;
wherein the plurality of synthetic instruments performs test functions in accordance with a test program created for the external device, wherein the test program is configurable on-the-fly to instruct the plurality of synthetic instruments to perform the plurality of test functions associated with different types of test instruments and multiple instances of a single type of test instrument in parallel during different phases of the test program.

* * * * *